United States Patent [19]
McKinnon et al.

[11] Patent Number: 5,879,738
[45] Date of Patent: Mar. 9, 1999

[54] METHOD FOR FLUID TRANSPORT FOR THE SURFACE TREATMENT OF PLANAR SUBSTRATES

[75] Inventors: Allan H. McKinnon, 1405 Wagonwheel Ct., Irving, Tex. 75061; Charles R. Kidd, Irving, Tex.; Michael Gulla, Osprey, Fla.

[73] Assignee: Allan H. McKinnon, Irving, Tex.

[21] Appl. No.: 859,765

[22] Filed: May 21, 1997

Related U.S. Application Data

[62] Division of Ser. No. 498,981, Jul. 6, 1995, Pat. No. 5,741,361.

[51] Int. Cl.$^6$ .............................. B05D 1/28; B05D 5/12
[52] U.S. Cl. .................... 427/96; 427/97; 427/255.5; 427/428; 427/434.3; 427/434.5; 118/244; 118/249; 118/410; 118/429; 34/465
[58] Field of Search ............ 427/96, 97, 255.5, 427/428, 434.3, 434.5; 118/258, 244, 407, 429, 224, 249, 250, 216, 211, DIG. 2, 410; 34/318, 326, 465

[56] References Cited

U.S. PATENT DOCUMENTS

| | | |
|---|---|---|
| 3,535,157 | 12/1967 | Steinhoff et al. . |
| 3,561,400 | 2/1971 | Smitzer et al. ............... 118/637 |
| 4,789,405 | 12/1988 | Blasing et al. . |
| 4,999,079 | 3/1991 | Ash . |
| 5,289,639 | 3/1994 | Bard et al. . |
| 5,374,331 | 12/1994 | Costello ............... 156/64 D |

FOREIGN PATENT DOCUMENTS

WO 92/10923  6/1992  WIPO .

*Primary Examiner*—Katherine A. Bareford
*Attorney, Agent, or Firm*—Robert L. Goldberg

[57] ABSTRACT

An apparatus and method for treating the walls of apertures passing through a planar substrate with a fluid treatment solution. The method comprises placement of a pressurized fluid wedge beneath, above, or both beneath and above a planar substrate as it passes through a treatment chamber. The apparatus that forms the fluid wedge is a roller assembly comprising a roller within a shroud which carries fluid as it rotates through a gap between the roller and the shroud. The roller provides the dual function of forming the fluid wedge and conveying the planar substrate through the treatment chamber.

15 Claims, 3 Drawing Sheets

METHOD FOR FLUID TRANSPORT FOR THE SURFACE TREATMENT OF PLANAR SUBSTRATES

This is a divisional of application Ser. No. 08/498,981 filed on Jul. 6, 1995, now U.S. Pat. No. 5,741,361.

BACKGROUND OF THE INVENTION

1. Introduction

This invention relates to a device for contacting surfaces with fluids especially adapted for forcing fluids through apertures passing through a planar substrate. More particularly, this invention relates to a fluid treatment device that is especially useful for the fabrication of printed circuit boards where substantial and complete fluid contact with the walls of through-holes within the printed circuit board substrate is critical for void free metallization and hole wall adhesion.

2. Description of the Prior Art

Printed circuit boards have solid metallic circuits formed from a conductive material positioned on one or both surfaces of an insulating dielectric material. Where the printed circuit board has two conductive surfaces positioned on opposite sides of a single dielectric layer, the resulting circuit board is known as a "double-sided circuit board". To provide electrical connections between circuits on opposite sides of a double-sided circuit board, a hole is typically drilled or punched through the double-sided circuit board substrate, i.e., through two metallic layers and a dielectric layer. These holes are known in the art as "through-holes" or, following metallization, "plated through-holes". To accommodate multiple circuits in a single printed circuit board, multiple copper layers are sandwiched between layers of dielectric material to produce a board known as a "multi-layer circuit board". Analogous to the double-sided circuit board, the multi-layer circuit board also uses metallized through-holes or "vias" or blind vias to provide electrical conductivity between circuit layers.

Various processes have evolved over the years for forming conductive pathways between circuit layers separated by a dielectric layer, i.e.—for metallizing the walls of the through-holes passing through the circuit board. Initially, when the double sided circuit board was first produced, mechanical means such as rivets or eyelet's were inserted into the through-hole to act as a conductive pathway. However, the use of rivets or eyelet's was labor intensive and the metallic pathways so formed proved to be unreliable during use.

Current methods for forming metallic pathways in printed circuit board manufacture involve chemical metallization of the walls of through-holes. The predominant method for metallizing through-holes is disclosed in U.S. Pat. No. 3,011,920 incorporated herein by reference. The principal steps involved in the practice of this method involve contact of the printed circuit board substrate inclusive of the through-holes with an aqueous electroless plating catalyst composition comprising a reduced palladium-tin colloid followed by contact with an accelerator and then with an electroless plating solution, typically a copper plating solution. Contact of the palladium-tin colloid with the walls of the through-hole results in adsorption of the palladium-tin colloid on the through-hole walls. Subsequent contact with the accelerator removes protective colloids and contact with the electroless copper plating solution results in metal deposition onto the adsorbed colloidal palladium particles.

The electroless metal deposition process described above involves multiple fluid treatment steps in addition to the principal steps of contact with a palladium-tin colloid and an electroless copper plating solution. The walls of the through-holes have to be pre-treated to enhance adsorption of the colloid onto the walls. Pretreatment may include the steps of contact with an organic solution to soften the walls of the through-holes, an oxidant to etch back or desmear the hole walls, a neutralizer to remove residues resulting from the step of oxidation, a conditioner to enhance adsorption of the colloid onto the walls, etc. As discussed above, following treatment with the palladium-tin colloid, the through-hole walls are often treated with an accelerator solution to dissolve protective colloid from the adsorbed palladium-tin colloid and thereby activate dormant catalytic sites. Following electroless metal plating, the deposit is often enhanced (thickened) by electrolytic metal deposition. Water rinses are used between each of the fluid treatment steps.

In each of the fluid treatment steps described above, complete fluid contact with all surfaces of the through-hole wall is essential to avoid voids or disruptions in the metal deposit over the walls of the through-hole. Voids are formed as a consequence of incomplete metallization of the hole walls often due to incomplete or inadequate fluid treatment in any of the above described pretreatment steps, especially in the treatment of high aspect ratio holes (large length to diameter ratio) now more frequently required for increased board densification. Voids can result in rejection of a printed circuit board or failure of an electronic device in which the circuit is used.

Recently, several methods for direct electroplating walls of through-holes have been developed. These methods do not rely upon an intermediate step of electroless metal deposition. In accordance with one such method, the palladium-tin colloid catalyst used for electroless metal plating is found to be sufficiently conductive for electrolytic plating when adsorbed onto the walls of the through-hole in sufficient concentration. This method is disclosed in U.K. Patent No. 2,123,036 incorporated herein by reference. An alternative to this method is disclosed in U.S. Pat. Nos. 5,017,742 and 5,207,888, also incorporated herein by reference. With respect to this latter method, the same palladium-tin colloid used for electroless plating is treated to convert the same to a sulfide to thereby enhance its conductivity.

A more recently utilized direct plate process for metallizing the walls of hole-walls employs dispersions of carbon black or graphite for the formation of a conductive coating. The use of graphite to form conductive coatings on through-hole walls is known and disclosed in U.S. Pat. No. 2,897,409 incorporated herein by reference. Current processes are disclosed, for example, in U.S. Pat. Nos. 4,619,741 and 5,389,270, each incorporated herein by reference. In accordance with the procedures set forth in these patents, a dispersion of carbon black or graphite is passed through the through-holes to form a coating of the dispersion on the hole-walls. The coating is dried to yield an adhesively bonded conductive layer of the carbon black or graphite which is sufficiently conductive for electroplating in a conventional manner.

As in electroless metal plating, all of the direct plate methods for metallization of through-holes require multiple fluid treatment steps and all require full contact of a treatment fluid with the hole walls for total coverage of the hole wall with metal during the plating step. This is especially the case using carbon black or graphite dispersions where defect free dried coatings are essential for void free metal deposits and hole wall adhesion.

Prior art methods for treatment of through-holes with treatment fluids have involved the use of sequential dip tanks. In accordance with these prior art methods, circuit board substrates are racked on a suitable rack and the racks are then lowered into a first dip tank containing treatment fluid, held in that dip tank for a suitable period of time, raised and immersed in the next dip tank for further treatment. This process is continued through a sequence of tanks to a final metal plating tank. The process is labor intensive because the boards have to be racked and then unracked and the immersion time in each tank may be lengthy. In addition, the process uses large volumes of chemicals resulting in the need for excessive waste treatment procedures. A recent alternative to the use of dip tanks involves the use of conveyors to convey the printed circuit board substrates through a series of fluid treatment chambers. The substrates may be conveyed on a vertical or horizontal track using opposing rollers to pass the substrates along a predetermined path. Horizontal processing is currently preferred. In each treatment chamber, the fluid is applied to the circuit board substrate and into the through-holes typically using spray flood or jet nozzles.

In conveyerized processing of printed circuit board substrates, difficulties are encountered with spray nozzles for a variety of reasons. For example, the spray nozzle atomizes the fluid treatment solution causing it to become aerated, which can result in oxidation of oxygen sensitive components in the treatment solution. Moreover, due to the high energy of the fluid as it emerges from the spray nozzle and its turbulent flow, the treatment fluid fails to contact all surfaces of the through-hole as is necessary for complete metal coverage. In addition, following spraying of the treatment solution into the through-hole, some treatment fluid remains entrained within the interior of the through-hole. The entrained fluid is not readily removed by water rinsing and can block the through-hole preventing contact of the entire hole-wall with subsequent fluid treatment solutions. Moreover, spraying and atomizing of the treatment fluid lowers its temperature below the recommended treatment temperature for the fluid. Temperature control is known to be of importance in the metallizing of through-holes in printed circuit board manufacture.

Fluid jets are potentially more advantageous than spray nozzles because they are directional. However, it has been found that fluid jets fail to overcome the problem of entrainment of fluids within the interior of a through-hole and temperature drop. Attempts have been made to overcome the problems described above by use of specific arrays of fluid jets such as illustrated in U.S. Pat. No. 5,289,639 incorporated herein by reference, but these methods have to a large extent been unsuccessful and substantially increase the cost of printed wiring board production and equipment.

The problems described above have been exacerbated by the industry movement to e printed wiring boards with higher aspect ratios. The aspect ratio of a through-hole is the ratio of the thickness of a board to the diameter of the through-hole. As the aspect ratio increases, the ratio of the length of the hole to its diameter increases. The longer the hole and the smaller its diameter, the more difficult it will be for a treatment fluid to penetrate the entire length of the hole and the more readily the hole will entrain treatment fluid within its interior as it passes through the full sequence of treatment stations.

An alternative to spray nozzles and jet nozzles is disclosed in U.S. Pat. No. 4,789,405, incorporated herein by reference. In accordance with the procedures set forth in this patent, a printed circuit board substrate is passed over a surge line which is formed by a nozzle arrangement under a transporting path normal to the transporting direction of the board. A fluid treatment solution is applied to the lower surface of the circuit board substrate from a nozzle in the form of a standing wave. The nozzle can be formed as a plain perforation member provided with slots or holes arranged symmetrically or asymmetrically. The standing wave of the treatment fluid is said to have the capability of penetrating small diameter through-holes but in practice has not solved the problems described above. Moreover, the nozzle design needed to form the standing wave requires a nozzle having a large surface area parallel to the planar substrate. The combination of a nozzle of this design and the means required to convey the substrates over the nozzle consumes considerable space. A desire within the industry is to reduce the space required for a plating line.

SUMMARY OF THE INVENTION

The invention described herein is a device for mass transport of fluids to a surface. The device is especially useful for treating apertures passing through the full thickness of a planar substrate with a fluid treatment solution. An example of the use of the device is for the treatment of through holes in a dielectric substrate in the manufacture of printed circuit boards. In such manufacture, through-holes in the printed circuit board substrate are contacted with all of the treatment fluids required to metallize the holes inclusive of the pre-treatment solutions, the water rinses and the metal plating solutions which may be electroless plating solutions or direct electrolytic plating solutions as described above.

The device of the invention provides an elongated, pressurized fluid wedge that is in contact with and transverses the full width of the planar substrate as it is conveyed through a fluid treatment chamber. In accordance with the invention, as a planar substrate having apertures therethrough is conveyed across the fluid wedge, fluid is forced through the apertures as the substrate transverses the fluid wedge and the aperture come into contact with the wedge. Because the apertures are of relatively small diameter and the fluid wedge is pressurized, fluid is passed through the aperture as essentially a fluid laminar column at a relatively high velocity. Consequently, fluid contacts essentially all surfaces of the aperture as they pass through the fluid wedge and the high velocity of the fluid cleans the aperture of all residues and debris such as drilling residues while providing sufficient contact time with the hole walls to effectuate the desired chemistry.

The fluid wedge used to treat apertures in a substrate in accordance with the invention is provided by a roller assembly in contact with a planar substrate passing through a treatment chamber. The roller assembly may be positioned above, below or preferably, both above and below the planar substrate as it passes through the treatment chamber. The roller assembly comprises a roller contained within a protective shroud having a narrow outlet or gap between it and the shroud over a major portion of its length. The shroud is provided with a fluid inlet to permit pressurized treatment fluid to enter the shroud. The roller is rotated within its shroud to assist in conveying the substrate through the treatment chamber under pressure while holding the substrate in a fixed position during contact with treatment solution to thereby avoid distortion of the substrate during treatment. As the shroud fills with fluid, the fluid is propelled by the roller as it rotates towards and through the outlet between the roller and the shroud. Because the roller assembly is positioned in contact with the substrate as it passes through the treatment chamber and where the outlet in the assembly is directed toward the substrate, fluid passing from the outlet as it contacts the substrate is confined within a narrow opening defined by the substrate and the roller portion of the roller assembly thus forming a pressurized fluid wedge available for treatment of the apertures as described above.

Based upon the above, the roller assembly provides the multiple functions of forming a fluid wedge of treatment fluid while simultaneously assisting in conveyance of the planar substrate through the treatment chamber and preventing distortion of the planar substrate as it comes into contact with the pressurized fluid wedge. Thus, the need for separate space consuming nozzles is avoided, aeration is avoided and temperature drop is avoided.

DESCRIPTION OF THE PREFERRED EMBODIMENTS

The roller assembly of the subject invention is used to treat the apertures within a planar substrate with a treatment fluid. The invention is especially useful for the manufacture of printed circuit boards and for this reason, the description that follows will be limited to printed circuit board manufacture though it should be understood that the invention is not to be limited thereto.

The term "fluid" as used herein may mean any fluid used to treat apertures within a planar substrate and the term as used contemplates fluids that are gaseous or liquid. Gaseous fluids that may be used in accordance with the invention include air under positive pressure as would be used in a drying operation or under negative pressure as would be required to suction fluids from a surface, and treatment gases such as silanes as would be used in a silanizing process. The fluids in liquid form include those used for the manufacture of printed circuit boards such as treatment solutions for altering the walls of through holes as described elsewhere herein as well as fluids used for the treatment of planar substrates such as etchants, developers, cleaners, oxidizing chemicals, protective coatings, etc. The liquid can be aqueous. In the description that follows, liquid treatment solutions used for the fabrication of printed circuit boards will be discussed for purposes of exemplification.

Planar substrates used in the manufacture of printed circuit boards may be unclad dielectric, dielectric having copper cladding on one or both of its surfaces, and multi-layer structures having sequential layers of dielectric material and copper innerlayers. In order to provide conductivity from one side of a printed circuit board to the other side of the board, or through an array of sequential circuit layers, holes or apertures are drilled or punched through the board and the walls of the holes metallized to provide the necessary conductive pathways.

Figure 1:
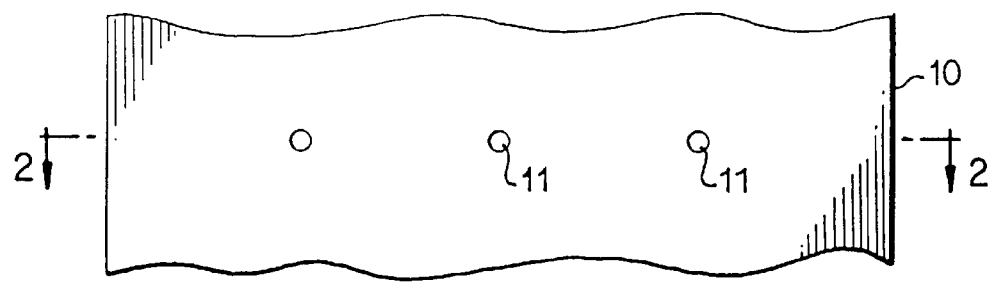
FIG. 1 of the drawings is a segment of a printed circuit board having apertures passing through the board.
Figure 2:
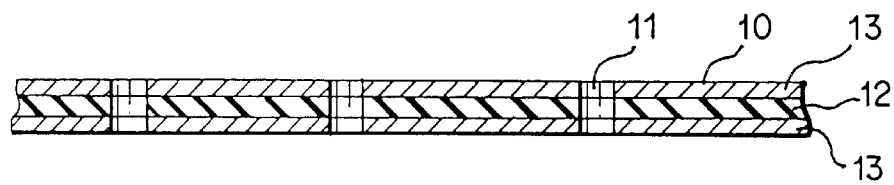
FIG. 2 is a cross section of the board of FIG. 1 taken along section line 2—2.

FIG. 1 of the drawings illustrates the top view of a segment of a printed circuit board substrate 10 having apertures or through-holes 11 drilled therethrough. FIG. 2 of the drawings is a cross-section of the segment of the board of FIG. 1 taken along section line A—A. As illustrated, the printed circuit board 10 having apertures therein 11 comprises a dielectric layer 12 having copper cladding 13 on both of its surfaces.

The printed circuit boards processed in accordance with the invention may be treated with any one of a number of treatment fluids including organic solvents, oxidants, neutralizers for the oxidants, cleaners and conditioners, etchants, plating solutions, rinse waters and the like. Treatment fluids used in printed circuit board manufacture are well-known in the art and disclosed in numerous publications including Clark, *Handbook of Printed Circuit Manufacturing*, Van Nostrand Reinhold Company, New York, 1985 incorporated herein by reference. In addition to conventional treatment solutions, the roller assembly of the subject invention can also be used with newly developed treatment fluids such as the carbon black and graphite dispersions disclosed in U.S. Pat. No. 5,389,270 referenced above.

In accordance with the invention, a printed circuit board substrate is treated in a conveyorized process where the substrates are placed on a conveyor and transported from one treatment chamber to the next, desirably in a horizontal plane though the roller assembly of the invention may be used for vertical processing as well. In general, a printed circuit substrate is conveyed by roller pairs having nips formed therebetween which engage the printed circuit substrate and convey it through a series of treatment stations. Conveyerized systems of the type contemplated are known and may be driven by means of a drive mechanism such as that described in U.S. Pat. Nos. 4,015,706 and 4,999,079, each incorporated herein by reference.

Figure 3:
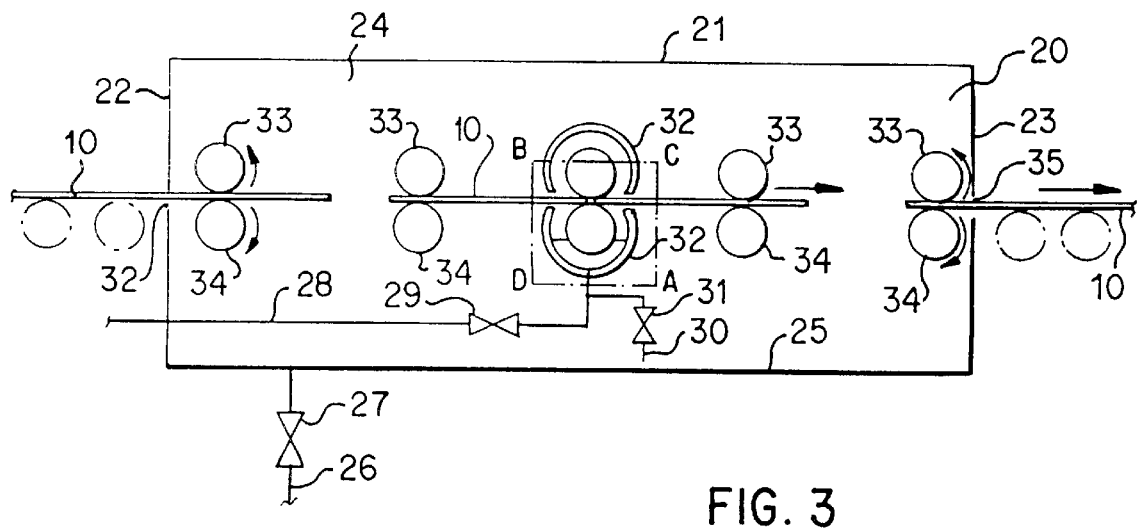
FIG. 3 is a treatment chamber illustrating the use and position of the roller assembly that is the subject of the invention.

A typical treatment chamber is illustrated in FIG. 3 of the drawings. As shown, the treatment chamber is designed for horizontal processing and is a closed chamber. However, it should be understood that the chamber used may be either an open or closed chamber and the design of the chamber does not constitute a part of the invention. With specific reference to FIG. 3 of the drawings, the chamber 20 is provided with a top wall 21, left and right end walls 22 and 23, respectively, a pair of opposed side walls such as 24, spaced apart transversely of the apparatus and a bottom wall 25 having a liquid discharge line 26 for removal of liquid from the chamber. The fluid discharge line 26 is provided with valve 27 to enable recirculation of the treatment fluid when the valve is closed or removal of the treatment fluid for discharge or regeneration when the valve is open. The treatment chamber is desirably filled with treatment fluid preferably to a level slightly below the plane formed by the circuit boards passing through the treatment chamber.

As aforesaid, the fluid treatment solution within chamber 21 may be introduced into chamber 21 from a source remote from the chamber or may be recirculated within the chamber. If from a remote source, the fluid enters chamber 21 through entry line 28 with valve 27 in the open position. If recirculated, the fluid would enter feed line 30 through valve 31 with valve 31 in the open position and valve 29 in the closed position. Either way, the treatment fluid is supplied to roller assembly 32 for formation of the fluid wedge used for the treatment of apertures in accordance with the invention.

With further reference to FIG. 3 of the drawings, planar substrates such as printed circuit board substrates 10 enter chamber 21 through entry port 32, are conveyed within the chamber by a drive mechanism comprising, for example, several opposed pairs of rollers 33 and 34 and exit the treatment chamber through exit port 35. In such an embodiment, the rollers provide a driving function to the planar substrates 10 as they proceed in their predetermined path through the treatment chamber. It should be noted that the use of rollers is not essential for the present invention as any form of conveying mechanism is suitable provided the mechanism adequately engages the printed circuit board substrates 10 as they pass over roller assembly 32 and the fluid wedge formed thereby.

Figure 4:
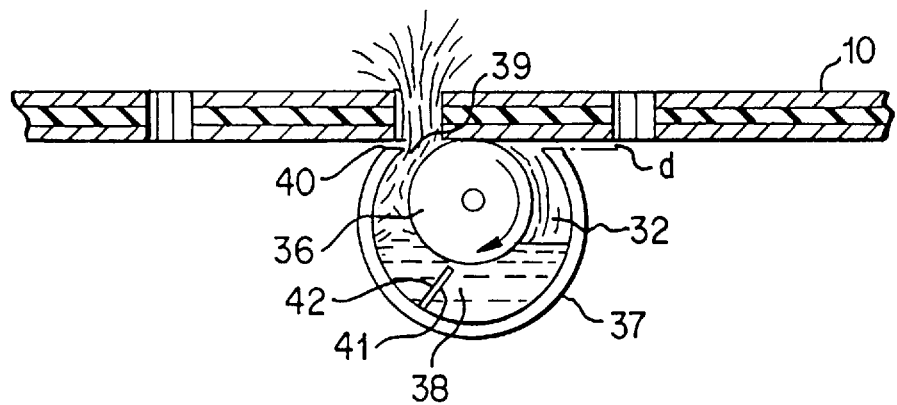
FIG. 4 is an enlargement in cross section of the roller assembly illustrated in FIG. 3 within the region A-B-C-D.
Figure 5:
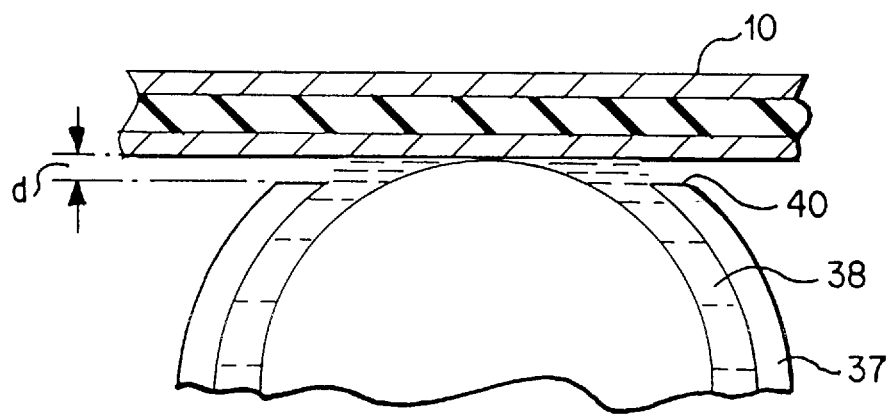
FIG. 5 illustrates a substrate in contact with a segment of the roller assembly and is an enlargement of a section of FIG. 4.

The roller assembly 32 of the invention is illustrated in greater detail in FIGS. 4 and 5 of the drawings. FIG. 4 is an enlargement of region A-B-C-D of FIG. 3. In FIG. 4, there is represented a planar substrate 10 in contact with and passing over roller 36. Roller 36 is encased within shroud 37 except for a minor portion of its circumference which protrudes from the shroud to permit contact of the roller with the planar substrate. Preferably, the roller protrudes from the shroud by a distance (as measured from the portion of the planar substrate in contact with the roller to the lip of the shroud) not exceeding 50 percent of the roller diameter, more preferably, by a distance equal to about 0.1 to 25 percent of its diameter and most preferably, by a distance equal to 0.2 and 2 percent of its diameter. The roller can also protrude from the shroud from a distance equal to between 0.1 and 1.0 percent of the diameter of the roller, or by a distance not exceeding 5 percent of the diameter of the roller. The distance the roller protrudes from the shroud is better illustrated in FIG. 5 of the drawings as space d—the space between the bottom surface of planar substrate 10 and the lip 40 of shroud 37.

The diameter of the roller may vary within broad limits such as from 1 to 12 inches and typically rollers used in the industry have a diameter of from about 1.5 to 4 inches. Treatment fluid 38 is flowed into shroud 37 using conventional delivery means (not shown) and fills the space between roller 36 and the inner wall of shroud 37. The delivery means may be through an inlet centered on the lower portion of the shroud or through multiple inlets spaced along the length of the lower portion of the shroud. As roller 36 is rotated on its axis in the direction of movement of the substrates, it provides the dual functions of conveying substrates 10 through the treatment chamber while simultaneously carrying treatment fluid 38 with it in the direction of rotation. The speed of rotation is not critical and is somewhat dependent upon the diameter of the roller. For a typical roller having a diameter between 1.5 and 4 inches, rotational speed may vary between about 10 and 100 revolutions per minute. Treatment fluid 38 exits the roller assembly 32 through gap or discharge port 39 between roller 37 and the top lip 40 of shroud 37. Roller 36 is desirably in contact with the bottom surface of substrate 10 and upper lip 40 of shroud 37 is in close proximity to substrate 10 if the substrate has aperatures passing therethrough, whereby the top surface of roller 36 protrudes slightly above the shroud. Preferably, the roller protrudes above the top lip 40 of the shroud by a distance of no more than 0.50" and more preferably, no more than 0.25" thus creating a space between the top lip of the shroud and the bottom of the substrate 10. Treatment fluid 38 passing through gap 39 is entrapped within the confined space defined by the bottom surface of substrate 10, roller 36 and upper lip 40 of shroud 37, and thereby has imparted to it a positive pressure head. This entrapped pressurized treatment fluid is defined herein as the fluid wedge which is pressed against the bottom surface of substrate 10. As substrate 10 passes along its path through the treatment chamber and apertures 11 within substrate 10 pass over the fluid wedge, the treatment fluid 38, under positive pressure, is forced through the apertures as a liquid laminar column at-a reasonably high velocity thereby intimately contacting all surfaces of the walls of the aperture and removing debris and residues therefrom. Gap 39 is desirably at least as long as the width of circuit substrate 10. Therefore, the fluid wedge transverses the full width of the substrate and all apertures across the width of the substrate are treated as they pass over the fluid wedge.

Figure 6:
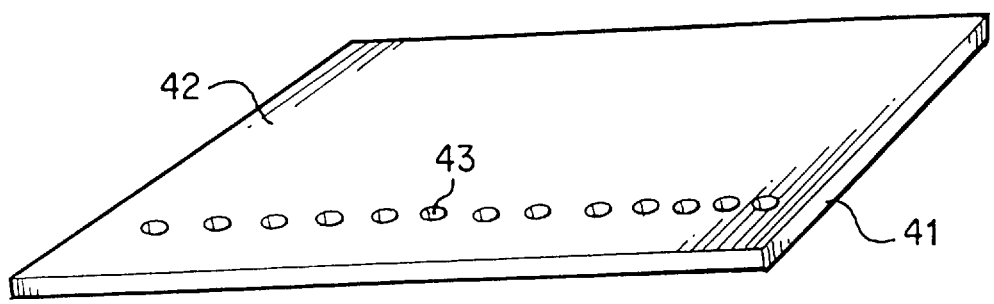
FIG. 6 shows a plenum that may be inserted into the roller assembly of the invention.

With further reference to FIG. 4, it can be seen that a plenum 41 is desirably displaced across the interior cross-section of the shroud to constrict the flow of fluid through the shroud. This plenum is better illustrated in FIG. 6 which depicts the plenum in enlarged isometric view. The plenum consists of a flat plate 42 having a plurality of openings represented as holes 43 passing through the full thickness of the plenum. The openings may be of any configuration such as slits, elipses, etc. The constriction placed within the shroud serves to increase directionally the velocity of the treatment fluid as it is carried by the roller through gap 39 to form the fluid wedge.

The treatment apparatus illustrated in FIGS. 3 through 5 of the drawings demonstrates the use of a single roller assembly in accordance with the invention used in a horizontal treatment mode. It should be understood that roller assembly 32 illustrated in FIG. 3 can be placed on both the upper and lower surfaces of the substrate in which case greater dimensional stability will be afforded the substrates as they pass over and under fluid wedges. Moreover, multiple roller assemblies permit more efficient treatment of the through-holes. If used on both sides of a substrate, the roller assemblies are desirably vertically displaced from each other so that the fluid passing through an aperture from one side of the substrate will not interfere with fluid passing through the aperture from the other side of the substrate. The rollers are desirably offset from each other by at least one inch— i.e., the center of rotation of one roller is displaced from the center of rotation of another roller on a vertical axis by at least one inch.

The roller assemblies of the invention may also be used in other than for horizontal processing. Thus, the substrates may be conveyed vertically or at any other desired angle. The fluid wedge will form regardless of the angle of conveyance due to the confined area in which the fluid is projected and in which the fluid wedge is contained.

Desirably, the opposed rollers used both to convey the planar substrates through the treatment chamber and used as part of the roller assembly to form the fluid wedge have surfaces that are resilient such that the rollers will be in a pressed together engagement with each other when no substrate is passing between the rollers. When a substrate such as substrate 10 passes between the rollers, the surface of the rollers desirably resiliently deflect, or deform sufficiently to accommodate the thickness of the substrate passing therebetween. This may be accomplished by using rollers of an elastomeric or felt like surface, as desired, selected to be compatible with the conditions imposed by the treatment fluid. Alternatively, the rollers may be non-resilient but spring loaded thereby permitting engagement between the planar substrate and the rollers. Thus, opposed rollers of any given pair are somewhat squeezed together in their normal mounting operation, and when an article passes through the nip formed between such rollers, they will in turn squeeze the article and thereby wipe substantial amounts of the treatment fluid from the surfaces thereof.

Figure 7:
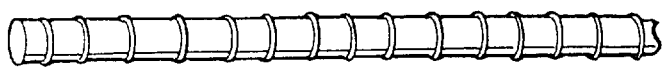
FIGS. 7,8,9,10 and 11 illustrate rollers having differing configurations that may be used in the roller assembly of the invention.
Figure 8:
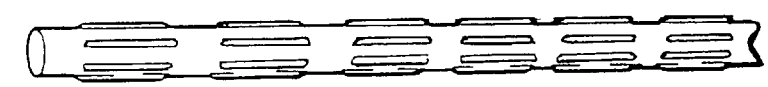
Figure 9:
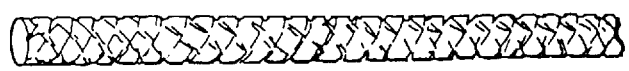
Figure 10:
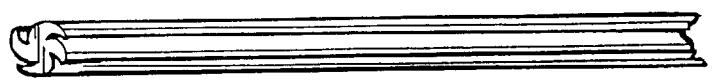
Figure 11:
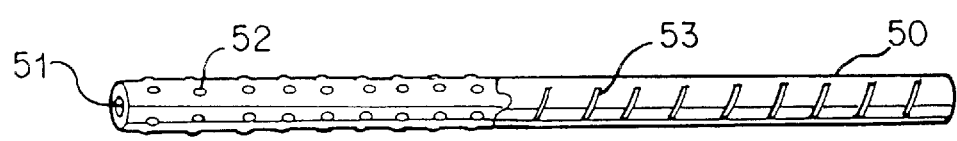

Though the roller portion of the roller assembly may have a smooth surface, it may also have an irregular surface designed to increase the volume of treatment solution carried through the gap between the roller and the shroud. For example, the roller can have vertical grooves as exemplified in FIG. 7, horizontal grooving as exemplified in FIG. 8, knurled grooving as exemplified in FIG. 9 or lengthwise indentations as exemplified in FIG. 10. Anyone of these configurations will increase the volume of the treatment fluid carried through the gap and thereby increase the positive pressure of the fluid constituting the fluid wedge. In addition, the roller may be designed so as to transport the fluid from the feed line directly into the shroud. This embodiment of the invention is illustrated in FIG. 11 of the drawings where roller 50 has channel 51 running along its length. The channel is in open communication with a series of openings such as holes 52 or slits 53. Fluid is passed through the hollow channel 51 and enters the shroud through the openings passing through the roller.

The invention may be better understood by reference to the following example which illustrates the use of the roller assembly of the invention for formation of a graphite coating on the walls of through holes passing through a copper clad circuit board base material.

A circuit board substrate suitable for purposes of this example would be a 1 ounce copper clad FR-4 epoxy board measuring 12 inches by 18 inches provided with an array of drilled holes of varying diameter ranging between 10 and 30 mils. The board would have been prepared by having its holes cleaned and conditioned by immersion for about 5 minutes in a cleaner conditioner such as that disclosed in Example 3 of International Publication No. WO/94/26958 referenced above at a temperature of about 135 degrees F.

A graphite treatment solution would be provided that would be about 5% by weight graphite particles having a mean particle size of about 1 micron. The graphite particles would be dispersed in aqueous medium using a suitable suspending agent such as carboxymethylcellulose and an anionic surfactant. A suitable graphite dispersion would be available from Electrochemicals Corporation under the tradename Shadow.

The above described graphite dispersion would be made up in a polyethylene 200 gallon holding tank fitted with a centrifugal pump capable of circulating the graphite dispersion at a flow rate of about 10 gallons per minute. A horizontal track would be placed above the tank. The track would be equipped with a plurality of opposed feed roller pairs having a diameter of 1.75 inches and coated with polybutadiene. Sufficient roller pairs would be provided to pass the copper clad circuit boards across the top of the treatment tank. The roller pairs would be arranged such that the copper clad circuit board substrates would pass about 5 inches above the surface of the tank containing the graphite dispersion. One of the rollers of the opposing roller pairs would be replaced by the roller assembly of this invention. Thus, the roller within the roller assembly would have a diameter of 1.75 inches and be encased within a shroud having a diameter of 4 inches. The roller and shroud combination would be 4 feet in length and transverse the holding tank in a direction perpendicular to the direction of passage of the circuit board substrates through the tank. The roller within the roller assembly would protrude above the top of the shroud by a distance of about 0.035 inches thus defining the distance between the fluid discharge point of the roller assembly and the lower surface of the circuit board substrate. The shroud which functions as a fluid medium manifold would be provided with a 0.5 inch entry port midway along its length which would be connected to the circulating pump of the holding tank for the graphite dispersion.

In use, the rollers would rotate at a speed of 15 RPM. The circulating pump would be turned on and fluid would pass from the holding tank into the shroud at a rate of 5 gallons per minute. Rotation of the roller within the shroud would force graphite dispersion against the underside of the circuit board substrate. Immediately as apertures within a circuit board substrate passes to the roller, the graphite dispersion is forced through the aperture as a liquid column—i.e., laminar flow, leaving a graphite coating on the hole wall surfaces.

Following formation of the coating of graphite, the circuit board is passed to an oven for drying of the graphite coating.

We claim:

1. A method for treating a planar substrate with a treatment fluid, said method comprising the steps of:

a. passing a planar substrate to a treatment chamber;

b. contacting at least one surface of the planar substrate within said treatment chamber with a roller assembly comprising a roller within a shroud filled with treatment fluid and means for rotating said roller, said roller having a major portion of its circumference within said shroud and a minor portion of its circumference protruding above the shroud, said shroud and roller being positioned to enable contact of the roller with said planar substrate as it passes through the treatment chamber, said roller being positioned within said shroud so as to define an elongated gap between the roller and the shroud along a major portion of the length of the shroud, the top of the shroud being positioned with respect to the planar substrate whereby said roller, the top of said shroud and said planar substrate define a confined space whereby treatment fluid discharged from the roller assembly through said gap is discharged into said confined space and into contact with the planar substrate in the form of an entrapped pressurized wedge of fluid;

c. passing treatment fluid into said shroud; and d. rotating said roller to simultaneously move said planar substrate through the treatment chamber and to pass treatment fluid under pressure into said confined space defined by the roller, the planar substrate and a top surface of the shroud and into contact with the planar substrate in the form of an entrapped pressurized wedge of said treatment fluid.

2. The process of claim 1 where the planar substrate has apertures passing therethrough.

3. The process of claim 2 where the treatment fluid is projected into the apertures within the planar substrate as the apertures pass over the fluid wedge.

4. The process of claim 1 where the roller protrudes from the shroud by a distance not exceeding 5 percent of a diameter of the roller.

5. The process of claim 4 where the distance is equal to between 0.1 and 1.0 percent of the diameter of the roller.

6. The process of claim 4 where the distance does not exceed 0.25 inches.

7. The process of claim 1 where a diameter of the roller can be between 1 and 12 inches.

8. The process of claim 7 where the diameter can be between 1.5 and 4 inches.

9. The process of claim 1 where the treatment fluid is aqueous.

10. The process of claim 9 where the treatment fluid is a graphite dispersion.

11. The process of claim 1 where the treatment fluid is gaseous.

12. The process of claim 11 where the treatment fluid is air.

13. The process of claim 1 where the planar substrate is a circuit board base material having apertures passing therethrough.

14. The process of claim 1 where the roller assembly is placed above an open treatment tank.

15. The process of claim 1 where the surface of the roller has depressions to carry an increased volume of fluid through the discharge gap defined by the roller and the shroud.

* * * * *